United States Patent
Huang et al.

(10) Patent No.: US 9,966,490 B1
(45) Date of Patent: May 8, 2018

(54) ULTRAVIOLET SENSOR AND METHOD OF MANUFACTURING THE SAME

(71) Applicant: National Taiwan University of Science and Technology, Taipei (TW)

(72) Inventors: Bohr-Ran Huang, Taipei (TW); Jinn Chu, Taipei (TW); You-Syuan Chen, Taipei (TW); Chia-Hao Chang, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 0 days. days.

(21) Appl. No.: 15/613,828

(22) Filed: Jun. 5, 2017

(30) Foreign Application Priority Data

Mar. 13, 2017 (TW) .............................. 106108088 A

(51) Int. Cl.
| | |
|---|---|
| *H01L 31/108* | (2006.01) |
| *H01L 31/0296* | (2006.01) |
| *H01L 31/0392* | (2006.01) |
| *H01L 31/0352* | (2006.01) |
| *H01L 31/0224* | (2006.01) |

(52) U.S. Cl.
CPC ...... *H01L 31/1085* (2013.01); *H01L 31/0296* (2013.01); *H01L 31/022408* (2013.01); *H01L 31/03925* (2013.01); *H01L 31/035227* (2013.01)

(58) Field of Classification Search
CPC ......... H01L 31/1085; H01L 31/022408; H01L 31/035227; H01L 31/0296; H01L 31/03925
See application file for complete search history.

(56) References Cited

U.S. PATENT DOCUMENTS

| | | | | |
|---|---|---|---|---|
| 2005/0116263 A1* | 6/2005 | Lu | .................... | C12Q 1/6825 |
| | | | | 257/252 |
| 2007/0132043 A1* | 6/2007 | Bradley | .............. | B82Y 10/00 |
| | | | | 257/414 |
| 2007/0210349 A1* | 9/2007 | Lu | ......................... | B82Y 5/00 |
| | | | | 257/252 |

(Continued)

OTHER PUBLICATIONS

Singh et al., A study of hydrothermally grown ZnO nanorod-based metal-semiconductor-metal UV detectors on glass substrates; Nanomaterials and Nanotechnology; vol. 7; Apr. 2017: pp. 1-5.*

(Continued)

*Primary Examiner* — John P Dulka
(74) *Attorney, Agent, or Firm* — Muncy, Geissler, Olds & Lowe, P.C.

(57) ABSTRACT

An ultraviolet sensor comprises a glass substrate, a semiconductor structure, an electrode layer and a thin film metallic glass. The semiconductor structure comprises a semiconductor seed layer formed on the glass substrate and a plurality of semiconductor nanostructures formed on the semiconductor seed layer. The electrode layer is formed between the semiconductor seed layer and the plurality of semiconductor nanostructures. The thin film metallic glass is in contact with the semiconductor structure, wherein an interface between the thin film metallic glass and the semiconductor structure forms a Schottky barrier junction to inhibit dark current and increase signal-to-noise ratio.

14 Claims, 3 Drawing Sheets

(56) References Cited

U.S. PATENT DOCUMENTS

| | | | |
|---|---|---|---|
| 2010/0276664 A1* | 11/2010 | Hersee ................... | B82Y 20/00 257/15 |
| 2011/0140072 A1* | 6/2011 | Varangis ................ | B82Y 20/00 257/9 |
| 2015/0053312 A1* | 2/2015 | Chu ........................ | C22C 45/10 148/403 |

OTHER PUBLICATIONS

Ferhati et al., Improved ZnO/glass thin film UV photodetector performance based on introduction of intermediate metallic sublayers; Materials Today: Proceedings 4 (2017); pp. 6930-6937.*

Huang et al., Few-Layer Thin-Film Metallic Glass-Enhanced Optical Properties of ZnO Nanostructures; ACS Appl. Mater. Interfaces, 2017, 9 (45), pp. 39475-39483.*

Derwent Abstract Chinese Patent Document: CN 106057960 A (Jun. 28, 2016); Published 2018; 3 pages.*

* cited by examiner

ULTRAVIOLET SENSOR AND METHOD OF MANUFACTURING THE SAME

CROSS-REFERENCE TO RELATED APPLICATION

This application claims the priority benefits of Taiwan Patent Application No. 106108088, filed on Mar. 13, 2017, the entirety of which is hereby incorporated by reference herein and made a part of this specification.

BACKGROUND OF THE INVENTION

1. Field of the Invention

The present disclosure generally relates to an ultraviolet sensor and a method of manufacturing the same, and more particularly to an ultraviolet sensor incorporating a thin film metallic glass and a method of manufacturing the same, capable of inhibiting dark current and increasing signal-to-noise ratio.

2. Description of Related Art

Ultraviolet sensors are widely used in various fields of our daily lives, such as military, astronomical research, medical, sterilization, agriculture or communication. The operation principle of ultraviolet sensors is to convert the received ultraviolet light into electrical signals by photosensitive material. In order to enhance the applicability of ultraviolet sensors and to satisfy the needs in use, the selection of photosensitive material and the improvement of performance are important topics in current research.

Since the most sensitive wavelengths of silicon-based photodiodes do not fall within the wavelength range of ultraviolet light, and the band gap of silicon is only 1.2 eV at ambient temperature, the problems of poor visible light response and low quantum conversion efficiency of ultraviolet light band may be solved by using a wide band gap semiconductor as the ultraviolet sensor, such as zinc oxide with a band gap up to 3.3 eV. This type of ultraviolet sensors may be operated at ambient temperature without an external optical filter to provide the effect of no response to visible light. These sensors have high stability, high gain of photocurrent and time response. However, the disadvantages of excessively low signal-to-noise ratio and long response time still exist when using a wide band gap semiconductor as the ultraviolet sensor.

Accordingly, there is a need for providing an ultraviolet sensor for inhibiting dark current and increasing signal-to-noise ratio effectively.

SUMMARY OF THE INVENTION

A primary object of this disclosure is to provide an ultraviolet sensor which comprises a thin film metallic glass and a method of manufacturing the same to decrease or inhibit dark current and increase signal-to-noise ratio effectively.

To achieve the aforesaid and other objects, the ultraviolet sensor of this disclosure comprises a glass substrate, a semiconductor structure, an electrode layer and a thin film metallic glass. The semiconductor structure comprises a semiconductor seed layer formed on the glass substrate and a plurality of semiconductor nanostructures formed on the semiconductor seed layer. The electrode layer is formed between the semiconductor seed layer and the plurality of semiconductor nanostructures. The thin film metallic glass is in contact with the semiconductor structure, wherein an interface between the thin film metallic glass and the semiconductor structure forms a Schottky barrier junction to inhibit dark current and increase signal-to-noise ratio.

In one embodiment of this disclosure, the thin film metallic glass is subject to an annealing process to promote amorphization of the thin film metallic glass.

In one embodiment of this disclosure, the thin film metallic glass is configured between the glass substrate and the semiconductor seed layer.

In one embodiment of this disclosure, the thin film metallic glass is formed on the plurality of semiconductor nanostructures.

In one embodiment of this disclosure, each semiconductor nanostructure is configured as a nanotube or a nanorod.

In one embodiment of this disclosure, each semiconductor nanostructure is substantially perpendicular to the semiconductor seed layer.

In one embodiment of this disclosure, the thin film metallic glass comprises a copper-based thin film metallic glass.

In one embodiment of this disclosure, the thin film metallic glass comprises a discrete structure.

The method of manufacturing an ultraviolet sensor of this disclosure comprises: providing a glass substrate; forming a thin film metallic glass on the glass substrate; forming a semiconductor seed layer on the thin film metallic glass; forming an electrode layer on the semiconductor seed layer; and forming a plurality of semiconductor nanostructures on the electrode layer.

In one embodiment of this disclosure, the method further comprises, prior to forming the semiconductor seed layer on the thin film metallic glass, subjecting the thin film metallic glass to an annealing process to promote amorphization of the thin film metallic glass.

BRIEF DESCRIPTION OF THE DRAWINGS

The accompanying drawings are included to provide a further understanding of the invention, and are incorporated in and constitute a part of this specification. The drawings illustrate embodiments of the invention and, together with the descriptions, serve to explain the principles of the invention.

DESCRIPTION OF THE EMBODIMENTS

Since various aspects and embodiments are merely exemplary and not limiting, after reading this specification, skilled artisans appreciate that other aspects and embodiments are possible without departing from the scope of the disclosure. Other features and benefits of any one or more of the embodiments will be apparent from the following detailed description and the claims.

As used herein, the terms "comprises," "comprising," "includes," "including," "has," "having" or any other variation thereof are intended to cover a non-exclusive inclusion. For example, a component, structure, article, or apparatus that comprises a list of elements is not necessarily limited to only those elements but may include other elements not expressly listed or inherent to such component, structure, article, or apparatus.

Figure 1:
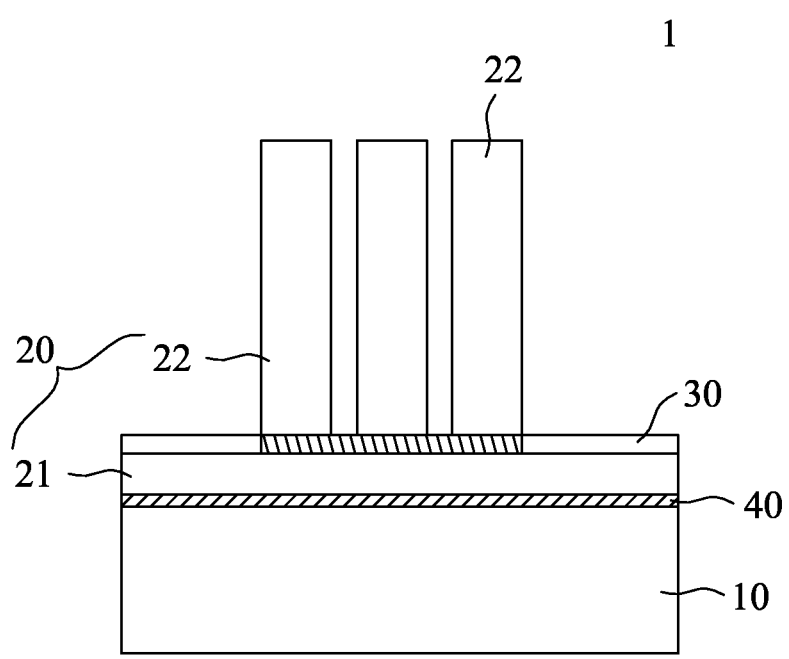
FIG. 1 illustrates a structural configuration of the first embodiment of an ultraviolet sensor of this disclosure.
Figure 2:
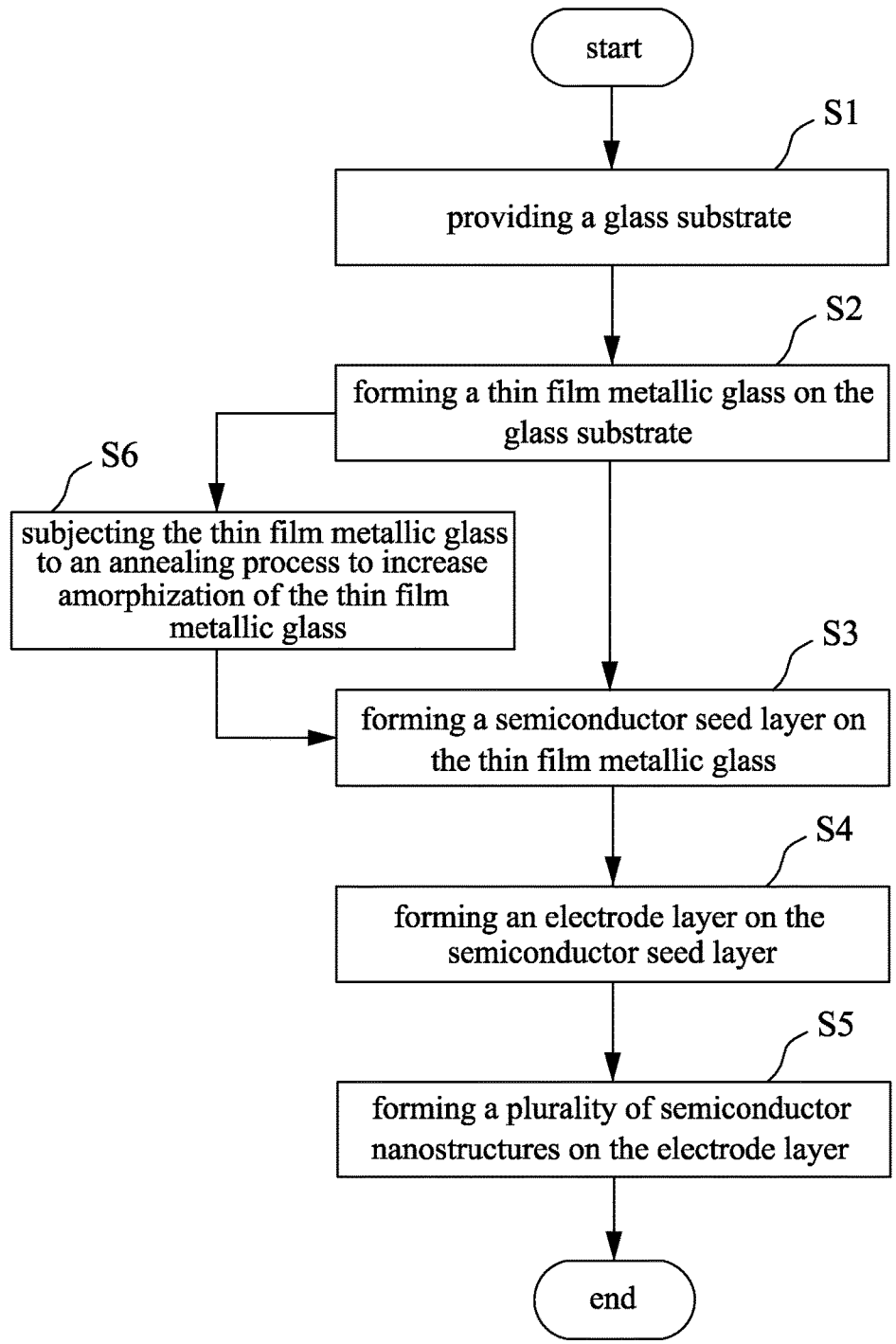
FIG. 2 illustrates a flowchart of the method of manufacturing an ultraviolet sensor of this disclosure.

Refer to FIGS. 1 and 2. As illustrated in FIG. 1, the ultraviolet sensor 1 of this disclosure comprises a glass substrate 10, a semiconductor structure 20, an electrode layer 30 and a thin film metallic glass 40, and the semiconductor structure 20 comprises a semiconductor seed layer 21 and a plurality of semiconductor nanostructures 22. As illustrated in FIGS. 1 and 2, in this embodiment, to fabricate the ultraviolet sensor 1 of this disclosure, the glass substrate 10 is provided first (step S1), and then a layer of the thin film metallic glass 40 is coated on one surface of the glass substrate 10 from a target made of metallic glass material by vacuum magnetron sputtering (step S2). The thin film metallic glass 40 in this embodiment has an amorphous structure in which atoms are arranged irregularly or without specific order in the structure. The thin film metallic glass 40 has several satisfactory properties including minimum grain boundary defects, excellent mechanical properties, low electron scattering and low current leakage. The thin film metallic glass 40 comprises a copper-based thin film metallic glass including copper, zirconium, aluminium and titanium, such as a Cu—Zr—Al—Ti alloy, but this disclosure is not limited thereto. For example, the Cu—Zr—Al—Ti alloy may comprises, in atomic ratio, 43 at % to 60 at % of Cu, 11 at % to 43 at % of Zr, 7 at % to 10 at % of Al and 5 at % to 34 at % of Ti. In one embodiment of this disclosure, the thickness of the thin film metallic glass 40 is not greater than 10 nm and preferably about 3 nm. Furthermore, because of the thinness of the thin film metallic glass 40, the thin film metallic glass 40 formed by sputtering comprises a discrete structure, indicating spaces or voids may be present among the particles of the thin film metallic glass 40.

Next, the semiconductor seed layer 21 of the semiconductor structure 20 is formed on the thin film metallic glass 40 by spin coating (step S3), such that the thin film metallic glass 40 is configured between the glass substrate 10 and the semiconductor seed layer 21, and one side of the thin film metallic glass 40 is in direct contact to the semiconductor structure 20. The semiconductor seed layer 21 may comprise a semiconductor metal oxide, such as zinc oxide as the main ingredient, which has satisfactory properties including low cost, non-toxic, and high stability, but this disclosure is not limited thereto.

After the semiconductor seed layer 21 has been formed, the electrode layer 30 is formed on the semiconductor seed layer 21 (step S4). The formation process of the electrode layer 30 may comprise producing an interdigital electrode from the semiconductor seed layer 21 by exposure and development processes. In one embodiment of this disclosure, the interdigital electrode has an interdigital length of about 100 μm, a width of about 5.5 μm and a gap of about 15 μm, but this disclosure is not limited thereto. After that, a layer of nickel with a thickness of about 5 nm is formed on the surface of the semiconductor seed layer 21 by vacuum magnetron sputtering equipment as a buffer layer, and a layer of platinum with a thickness of about 100 nm is formed by sputtering to serve as an electrode.

Finally, a plurality of semiconductor nanostructures 22 of the semiconductor structure 20 are formed on the surface of the electrode layer 30 (step S5). The plurality of semiconductor nanostructures 22 are formed by depositing semiconductor metal oxide, such as zinc oxide as the main ingredient, via a hydrothermal method. The semiconductor nanostructures 22 thus formed may be configured as nanotubes or nanorods, but this disclosure is not limited thereto.

Each semiconductor nanostructure 22 is substantially perpendicular to the semiconductor seed layer 21. The electrode layer 30 is configured between the semiconductor seed layer 21 and the plurality of semiconductor nanostructures 22. Accordingly, the ultraviolet sensor 1 of this disclosure forms a metal-semiconductor-metal ultraviolet sensor.

Further, in order to provide better properties to the thin film metallic glass 40, in one embodiment of the disclosure, after the thin film metallic glass 40 has been formed on the glass substrate 10, the thin film metallic glass 40 may be subject to an annealing process (step S6) to promote or increase amorphization of the thin film metallic glass 40. The annealing process comprises placing or standing still the thin film metallic glass 40 in an oxygen environment at a fixed temperature for 30 minutes. Said fixed temperature for the annealing process may be changed for different needs; for example, in one embodiment of the disclosure, the fixed temperature is 150° C.

Figure 3:
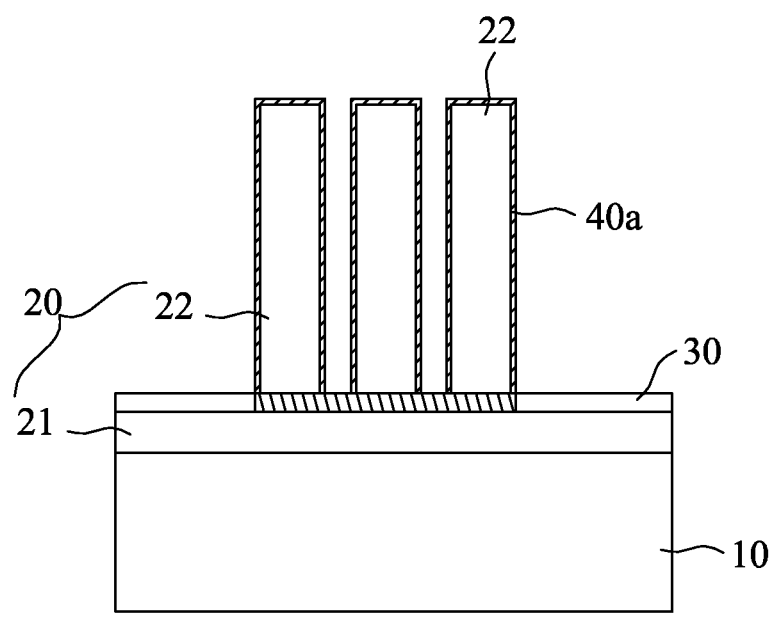
FIG. 3 illustrates a structural configuration of the second embodiment of an ultraviolet sensor of this disclosure.

Refer to FIG. 3, which illustrates the second embodiment of the ultraviolet sensor 1a of this disclosure. The second embodiment is a variation of the aforesaid first embodiment. As illustrated in FIG. 3, in this embodiment, the position of the thin film metallic glass, which is configured between the glass substrate 10 and the semiconductor seed layer 21 in the first embodiment, has been changed. In other words, the thin film metallic glass 40a of the ultraviolet sensor 1a is formed on the surfaces of the plurality of semiconductor nanostructures 22 in this embodiment by deposition after the plurality of semiconductor nanostructures 22 have been formed, such that the thin film metallic glass 40a is also in contact with the semiconductor structure 20. The ultraviolet sensor 1a in this embodiment similarly forms a metal-semiconductor-metal ultraviolet sensor.

In the following descriptions, the ultraviolet sensors 1, 1a of this disclosure serve as the experimental group and other different ultraviolet sensors serve as the comparative group. Electrical property measurements were performed for the experimental group and the comparative group under the same environment settings, and the data of the two groups were compared so as to confirm the actual efficacy of the ultraviolet sensors 1, 1a of this disclosure. In the following experiments, ultraviolet light source with the same parameters (ultraviolet wavelength of 365 nm, light intensity of 1 mW/cm$^2$, voltage of 5V) was used to irradiate the ultraviolet sensors of the experimental group and the comparative group in the normal atmospheric environment so as to measure and record electrical property data for comparison. In the experiments, the semiconductor structure of each ultraviolet sensor comprises zinc oxide as the main ingredient, and the thin film metallic glass comprises a copper-based thin film metallic glass.

First, in one embodiment where the plurality of semiconductor nanostructures of the semiconductor structure are configured as nanorods, the ultraviolet sensor without the thin film metallic glass is referred to as the comparative group A, the ultraviolet sensor with the thin film metallic glass (thickness of 3 nm) disposed on the semiconductor structure (corresponding to the aforesaid second embodiment in FIG. 3) is referred to as the experimental group B1, and the ultraviolet sensors with the thin film metallic glass (thickness of 3 nm) disposed below the semiconductor structure (corresponding to the aforesaid first embodiment in FIG. 1) and being subject to annealing processes (30 minutes) at different temperatures are referred to as the experimental groups B2-B4. Each ultraviolet sensor was irradiated with an ultraviolet light source to measure and record parameters including photocurrent, dark current, signal-tonoise ratio, response time, and recovery time of each sensor, as shown in Table 1. Herein the signal-to-noise ratio is defined as a ratio of the photocurrent ($I_{photo}$) to the dark current ($I_{dark}$), the unit of each current is ampere (A), and the unit of time is second (S).

TABLE 1

|  | $I_{dark}$ | $I_{photo}$ | Signal-to-noise ratio ($I_{photo}/I_{dark}$) | Response time (s) | Recovery time (s) |
| --- | --- | --- | --- | --- | --- |
| Comparative group A | 0.18 μA | 45.7 μA | 252.80 | 127 | 169 |
| Experimental group B1 | 59.60 μA | 0.40 μA | 6722.70 | 92 | 131 |
| Experimental group B2 (w/o annealing) | 2.84 nA | 26.0 μA | 9162.15 | 87 | 55 |
| Experimental group B3 (150° C. annealing) | 0.60 nA | 14.8 μA | 24505.30 | 89 | 77 |
| Experimental group B4 (300° C. annealing) | 2.83 nA | 36.8 μA | 13006.70 | 82 | 57 |

As shown in Table 1, the signal-to-noise ratio measured from any of the experimental groups B1-B4 with the thin film metallic glass was increased obviously compared to the comparative group A, and the response time and the recovery time measured from any of the experimental groups B1-B4 was decreased obviously indicating that the dark current may be decreased effectively due to the absence of grain boundary in the thin film metallic glass and a Schottky barrier junction formed at the interface between the thin film metallic glass and the semiconductor structure (with an energy barrier of about 0.65 eV). Therefore, the ultraviolet sensor which forms the thin film metallic glass is capable of inhibiting dark current and increasing the signal-to-noise ratio regardless of the location where the thin film metallic glass is formed relative to the semiconductor structure.

Moreover, by comparing the experimental group B1 with the experimental group B2, it can be observed that the signal-to-noise ratio, the response time and the recovery time measured from the ultraviolet sensor with the thin film metallic glass disposed below the semiconductor structure are better than the data measured from the ultraviolet sensor with the thin film metallic glass disposed on the semiconductor structure, showing enhancement of the signal-to-noise ratio resulted from forming the thin film metallic glass between the glass substrate and the semiconductor structure. Furthermore, data from the experimental groups B2-B4 reveal that the signal-to-noise ratio, the response time and the recovery time measured from the ultraviolet sensor with the thin film metallic glass subject to an annealing process are much better than the counterparts without any annealing process, indicating the promotion of amorphization of the thin film metallic glass caused by the annealing process of the thin film metallic glass. A preferred result is observed when the temperature of the annealing process is about 150° C., and the amorphization effect was not increased with the increase of the temperature.

In the following experiments, where the plurality of semiconductor nanostructures of the semiconductor structure are configured as nanotubes, given other conditions not expressly stated herein for the experimental groups and the comparative group are the same as those described in Table 1 above, several parameters were measured and recorded, including photocurrent, dark current, signal-to-noise ratio, response time, and recovery time of each sensor, as listed in Table 2.

TABLE 2

|  | $I_{dark}$ | $I_{photo}$ | Signal-to-noise ratio ($I_{photo}/I_{dark}$) | Response time (s) | Recovery time (s) |
| --- | --- | --- | --- | --- | --- |
| Comparative group A' | 75.9 nA | 0.16 mA | 2033.55 | 143 | 123 |
| Experimental group B1' | 0.18 nA | 0.83 μA | 7106.00 | 66 | 47 |
| Experimental group B2' (w/o annealing) | 0.26 nA | 5.13 μA | 19903.36 | 56 | 49 |
| Experimental group B3' (150° C. annealing) | 0.17 nA | 33.2 μA | 200332.30 | 58 | 34 |
| Experimental group B4' (300° C. annealing) | 0.27 nA | 42.0 μA | 155593.40 | 81 | 38 |

The overall performance listed in Table 2 is pretty much in line with the data in Table 1. The signal-to-noise ratio measured from any of the experimental groups B1'-B4' with the thin film metallic glass is higher than that of the comparative group A', and the response time and the recovery time measured from the experimental groups B1'-B4' are shorter. The data from Table 2 are more satisfactory than those with semiconductor nanostructures configured as nanorods, implying that nanotubes provide more surface area and depletion regions than nanorods and therefore advantageous to both inhibiting dark current and increasing signal-to-noise ratio.

The following experiments are presented for the purpose of exploring the influence of the thickness of the thin film metallic glass. Given that the plurality of semiconductor nanostructures of the semiconductor structure are configured as nanorods, the ultraviolet sensor with the thin film metallic glass (thickness of 3 nm) disposed on the semiconductor structure (corresponding to the aforesaid second embodiment in FIG. 3) is referred to as the comparative group C, and the ultraviolet sensors with the thin film metallic glass of different thickness disposed on the semiconductor structure (corresponding to the aforesaid second embodiment in FIG. 3) are referred to as the experimental groups D1-D3. Each ultraviolet sensor was irradiated with an ultraviolet light source, and several parameters are measured and recorded, including photocurrent, dark current and signal-to-noise ratio, as listed in Table 3.

TABLE 3

|  | $I_{dark}$ (A) | $I_{photo}$ (A) | Signal-to-noise ratio ($I_{photo}/I_{dark}$) |
| --- | --- | --- | --- |
| Comparative group C (thickness of 3 nm) | 5.96E−11 | 4.00E−07 | 6722.70 |
| Experimental group D1 (thickness of 6 nm) | 2.03E−10 | 7.38E−07 | 3634.23 |
| Experimental group D2 (thickness of 10 nm) | 7.06E−09 | 6.67E−06 | 943.98 |
| Experimental group D3 (thickness of 15 nm) | 2.57E−09 | 1.71E−06 | 663.75 |

As can be observed from Table 3, while the signal-to-noise ratios measured respectively from the comparative group C and any of the experimental groups D1-D3 are better than that of the comparative group A without the thin film metallic glass in Table 1, for the ultraviolet sensor with the thin film metallic glass disposed on the semiconductor structure, the signal-to-noise ratio decreases with the increase of the thickness of the thin film metallic glass, according to the experimental results of Table 3.

In the following experiments, given that the plurality of semiconductor nanostructures of the semiconductor structure are configured as nanotubes and other conditions not expressly stated herein for the experimental groups and the comparative group are the same as those described in Table 3 above, several parameters were measured and recorded, including photocurrent, dark current and signal-to-noise ratio of each sensor, as listed in Table 4.

TABLE 4

| | $I_{dark}$ (A) | $I_{photo}$ (A) | Signal-to-noise ratio ($I_{photo}/I_{dark}$) |
|---|---|---|---|
| Comparative group C' (thickness of 3 nm) | 1.17E−10 | 8.28E−07 | 7106.00 |
| Experimental group D1' (thickness of 6 nm) | 5.11E−10 | 2.65E−06 | 5178.83 |
| Experimental group D2' (thickness of 10 nm) | 1.20E−09 | 2.30E−06 | 1923.48 |
| Experimental group D3' (thickness of 15 nm) | 4.83E−09 | 2.48E−06 | 514.08 |

As shown in Table 4, with the increase in thickness of the thin film metallic glass, only the signal-to-noise ratio measured from the comparative group C' and the experimental group D1' are better than that of the comparative group A' without the thin film metallic glass in Table 2. When the thickness of the thin film metallic glass reaches 10 nm or greater, the signal-to-noise ratio measured from the ultraviolet sensor with the thin film metallic glass disposed on the semiconductor structure is lower than that of the ultraviolet sensor without the thin film metallic glass. Accordingly, the thickness of the thin film metallic glass is preferably less than 10 nm and more preferably less than or equal to 6 nm.

The following experiments are presented to study the influence of thickness and annealing process on the thin film metallic glass. Given that the plurality of semiconductor nanostructures of the semiconductor structure are configured as nanorods, the ultraviolet sensor with the thin film metallic glass (thickness of 3 nm) disposed below the semiconductor structure (corresponding to the aforesaid first embodiment in FIG. 1) is referred to as the comparative group E, and the ultraviolet sensors with the thin film metallic glass of different thickness disposed below the semiconductor structure (corresponding to the aforesaid first embodiment in FIG. 1) are referred to as the experimental groups F1-F3. Each ultraviolet sensor being subject to different annealing process was irradiated with an ultraviolet light source to measure and record the parameters including photocurrent, dark current and signal-to-noise ratio of each sensor, as listed in Table 5.

TABLE 5

| | $I_{dark}$ (A) | $I_{photo}$ (A) | Signal-to-noise ratio ($I_{photo}/I_{dark}$) |
|---|---|---|---|
| without annealing | | | |
| Comparative group E (thickness of 3 nm) | 2.84E−09 | 2.60E−05 | 9162.15 |
| Experimental group F1 (thickness of 6 nm) | 4.38E−09 | 2.89E−05 | 6602.55 |
| Experimental group F2 (thickness of 10 nm) | 3.18E−09 | 1.68E−05 | 5278.11 |
| Experimental group F3 (thickness of 15 nm) | 9.52E−09 | 3.53E−05 | 3704.75 |
| annealed at 150° C. | | | |
| Comparative group E (thickness of 3 nm) | 6.02E−10 | 1.48E−05 | 24505.30 |
| Experimental group F1 (thickness of 6 nm) | 3.64E−09 | 5.93E−05 | 16299.82 |
| Experimental group F2 (thickness of 10 nm) | 1.10E−09 | 1.42E−05 | 12971.37 |
| Experimental group F3 (thickness of 15 nm) | 4.85E−09 | 3.90E−05 | 8032.16 |
| annealed at 300° C. | | | |
| Comparative group E (thickness of 3 nm) | 2.83E−09 | 3.68E−05 | 13006.70 |
| Experimental group F1 (thickness of 6 nm) | 4.08E−09 | 3.30E−05 | 8090.82 |
| Experimental group F2 (thickness of 10 nm) | 5.45E−09 | 3.57E−05 | 6557.41 |
| Experimental group F3 (thickness of 15 nm) | 1.84E−08 | 9.27E−05 | 5024.67 |

As can be observed from Table 5, while the signal-to-noise ratios measured respectively from the comparative group E and any of the experimental groups F1-F3 with different annealing conditions are better than that of the comparative group A without the thin film metallic glass in Table 1, for the ultraviolet sensor with the thin film metallic glass disposed below the semiconductor structure, the signal-to-noise ratio at the same annealing condition decreases with the increase of the thickness of the thin film metallic glass according to the experimental results of Table 5. For the same thickness of the thin film metallic glass, the signal-to-noise ratio measured from the thin film metallic glass being subject to the annealing process is better than that of the thin film metallic glass without the annealing process, but the signal-to-noise ratio does not increase with the increase of the annealing temperature.

In the following experiments, given that the plurality of semiconductor nanostructures of the semiconductor structure are configured as nanotubes and other conditions not expressly stated herein for the experimental groups and the comparative group are the same as those described in Table 5, several parameters were measured and recorded, including photocurrent, dark current and signal-to-noise ratio of each sensor, as listed in Table 6.

TABLE 6

| | $I_{dark}$ (A) | $I_{photo}$ (A) | Signal-to-noise ratio ($I_{photo}/I_{dark}$) |
|---|---|---|---|
| without annealing | | | |
| Comparative group E' (thickness of 3 nm) | 2.58E−10 | 5.13E−06 | 19903.36 |
| Experimental group F1' (thickness of 6 nm) | 7.07E−09 | 6.46E−05 | 9137.99 |

TABLE 6-continued

|  | $I_{dark}$ (A) | $I_{photo}$ (A) | Signal-to-noise ratio ($I_{photo}/I_{dark}$) |
|---|---|---|---|
| Experimental group F2' (thickness of 10 nm) | 6.43E-10 | 4.42E-06 | 6878.68 |
| Experimental group F3' (thickness of 15 nm) annealed at 150° C. | 1.24E-08 | 2.77E-05 | 2233.63 |
| Comparative group E' (thickness of 3 nm) | 1.65E-10 | 3.32E-05 | 200332.30 |
| Experimental group F1' (thickness of 6 nm) | 1.29E-10 | 1.12E-05 | 86948.42 |
| Experimental group F2' (thickness of 10 nm) | 6.65E-10 | 2.43E-05 | 36454.76 |
| Experimental group F3' (thickness of 15 nm) annealed at 300° C. | 3.40E-09 | 4.86E-05 | 14312.36 |
| Comparative group E' (thickness of 3 nm) | 2.70E-10 | 4.20E-05 | 155593.40 |
| Experimental group F1' (thickness of 6 nm) | 8.84E-10 | 5.82E-05 | 65759.36 |
| Experimental group F2' (thickness of 10 nm) | 9.06E-11 | 1.96E-06 | 21608.70 |
| Experimental group F3' (thickness of 15 nm) | 1.39E-10 | 1.23E-06 | 8846.79 |

As can be observed from Table 6, while the signal-to-noise ratios measured respectively from the comparative group E' and any of the experimental groups F1'-F3' with different annealing conditions are better than that of the comparative group A' without the thin film metallic glass in Table 2, for the ultraviolet sensor with the thin film metallic glass disposed below the semiconductor structure, the signal-to-noise ratio decreases with the increase of the thickness of the thin film metallic glass under the same annealing condition, according to the experimental results of Table 6. For the same thickness of the thin film metallic glass, the signal-to-noise ratio measured from the thin film metallic glass being subject to the annealing process is better than that of the thin film metallic glass without the annealing process, but the signal-to-noise ratio does not increase with the increase of the annealing temperature. Accordingly, relative to the variation in the thickness of the thin film metallic glass, the annealing process of the thin film metallic glass has a greater influence on the signal-to-noise ratio of the ultraviolet sensor, and the signal-to-noise ratio of the ultraviolet sensor is effectively promoted if the thin film metallic glass has been subject to the annealing process.

Accordingly, the ultraviolet sensors 1, 1a of this disclosure, with the presence of the thin film metallic glass in contact with the semiconductor structure and the interface between the thin film metallic glass and the semiconductor structure that forms a Schottky barrier junction, can achieve inhibited dark current and increase in signal-to-noise ratio. The manufacturing process of this disclosure is simple, non-toxic and safe.

Furthermore, this disclosure further comprises a method of manufacturing the ultraviolet sensor 1.

The above detailed description is merely illustrative in nature and is not intended to limit the embodiments of the subject matter or the application and uses of such embodiments. Moreover, while at least one exemplary embodiment has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. An ultraviolet sensor, comprising:
    a glass substrate;
    a semiconductor structure, comprising a semiconductor seed layer formed on the glass substrate and a plurality of semiconductor nanostructures formed on the semiconductor seed layer;
    an electrode layer formed between the semiconductor seed layer and the plurality of semiconductor nanostructures; and
    a thin film metallic glass in contact with the semiconductor structure, wherein an interface between the thin film metallic glass and the semiconductor structure forms a Schottky barrier junction to inhibit dark current and increase signal-to-noise ratio.

2. The ultraviolet sensor of claim 1, wherein the thin film metallic glass is subject to an annealing process to promote amorphization of the thin film metallic glass.

3. The ultraviolet sensor of claim 1, wherein the thin film metallic glass is configured between the glass substrate and the semiconductor seed layer.

4. The ultraviolet sensor of claim 1, wherein the thin film metallic glass is formed on the plurality of semiconductor nanostructures.

5. The ultraviolet sensor of claim 1, wherein each semiconductor nanostructure is configured as a nanotube or a nanorod.

6. The ultraviolet sensor of claim 1, wherein each semiconductor nanostructure is substantially perpendicular to the semiconductor seed layer.

7. The ultraviolet sensor of claim 1, wherein the thin film metallic glass comprises a copper-based thin film metallic glass.

8. The ultraviolet sensor of claim 1, wherein the thin film metallic glass comprises a discrete structure.

9. A method of manufacturing an ultraviolet sensor, comprising:
    providing a glass substrate;
    forming a thin film metallic glass on the glass substrate;
    forming a semiconductor seed layer on the thin film metallic glass;
    forming an electrode layer on the semiconductor seed layer; and
    forming a plurality of semiconductor nanostructures on the electrode layer.

10. The method of claim 9, further comprising, prior to forming the semiconductor seed layer on the thin film metallic glass, subjecting the thin film metallic glass to an annealing process to promote amorphization of the thin film metallic glass.

11. The method of claim 9, wherein each semiconductor nanostructure is configured as a nanotube or a nanorod.

12. The method of claim 9, wherein each semiconductor nanostructure is substantially perpendicular to the semiconductor seed layer.

13. The method of claim 9, wherein the thin film metallic glass comprises a copper-based thin film metallic glass.

14. The method of claim 9, wherein the thin film metallic glass comprises a discrete structure.

* * * * *